United States Patent [19]

Basta et al.

[11] Patent Number: 5,658,614
[45] Date of Patent: Aug. 19, 1997

[54] PLATINUM ALUMINIDE CVD COATING METHOD

[75] Inventors: William C. Basta, Montague; David C. Punola; Bruce M. Warnes, both of Muskegon, all of Mich.

[73] Assignee: Howmet Research Corporation, Whitehall, Mich.

[21] Appl. No.: 330,694

[22] Filed: Oct. 28, 1994

[51] Int. Cl.$^6$ .................................................. C23C 16/00
[52] U.S. Cl. ........................... 427/253; 427/142; 427/250; 427/252; 427/405; 427/419.2; 427/419.1
[58] Field of Search ...................... 427/250, 252, 427/253, 142, 405, 419.1, 419.2; 428/670; 148/527; 29/889.1

[56] References Cited

U.S. PATENT DOCUMENTS

| | | |
|---|---|---|
| 3,486,927 | 12/1969 | Gauje . |
| 3,598,638 | 8/1971 | Levine . |
| 3,677,789 | 7/1972 | Bungardt . |
| 3,692,554 | 9/1972 | Bungardt . |
| 4,501,776 | 2/1985 | Shankar . |
| 4,962,005 | 10/1990 | Alperine et al. ........................ 428/670 |
| 5,254,413 | 10/1993 | Maricocchi ............................ 428/633 |

OTHER PUBLICATIONS

Evaluation of Simple Aluminide and Platinum Modified Aluminide Coatings on High Pressure Turbine Blades After Factory Engine Testing; Engineering Materials Technology Lab.; GE Aircraft Engines, Cincinnati, OH; pp. 1–8; Conner, et al.

Evaluation of Simple Aluminide and Platinum Modified Aluminide Coatings on High Pressure Turbine Blades After Factory Engine Testing—Round II; Engineering Materials Technology Lab.; GE Aircraft Engines, Cincinnati, OH; pp. 1–11; Conner.

Platinum Modified Aluminides—Present Status pp. 1–10; Smith and Boone.

Ductile to Brittle Transition Temperature Behavior of Platinum Modified Coatings; Materials Science and Engineering; 88, 1987, pp. 227–231; Vogel.

*Primary Examiner*—Roy V. King
*Attorney, Agent, or Firm*—Edward J. Timmer

[57] ABSTRACT

A method of improving the oxidation resistance of a platinum modified aluminide coating formed on a nickel base superalloy substrate, comprises providing a platinum layer on the substrate, heating the substrate in a coating retort to a temperature of at least about 1000° C., forming external of the coating retort a high purity coating gas comprising hydrogen and aluminum trichloride, and introducing the coating gas into the coating retort to contact the heated substrate to form an outwardly grown, single phase [(Ni,Pt)Al] platinum modified aluminide coating having reduced concentration of at least one of a substrate substitutional alloying element and a surface active tramp element selected from at least one of B, P, and S in said coating as compared to a platinum modified aluminide coating formed at a lower temperature.

11 Claims, 8 Drawing Sheets

Thickness = 49 μm
Average Composition
35.5 wt% Pt
25.6 wt% Al

Thickness = 74.3 μm
Average Composition
30.6 wt% Pt
19.96 wt% Al

Thickness = 52.8 μm
Average Composition
29.9 wt% Pt
31.3 wt% Al

Thickness = 88 μm
Average Composition
22.6 wt% Pt
23.2 wt% Al

Thickness = 78.3 μm
Average Composition
21.6 wt% Pt
24.1 wt% Al

Thickness = 77.5 μm
Average Composition
19 wt% Pt
18.5 wt% Al

PLATINUM ALUMINIDE CVD COATING METHOD

FIELD OF THE INVENTION

The present invention relates to an outwardly grown, single phase (Ni,Pt)Al platinum modified aluminide coating produced by chemical vapor deposition (CVD) under selected conditions effective to substantially reduce the concentration of substrate substitutional alloying elements, such as W, Mo, etc., and surface active tramp elements, such as B, P, and S, in the coating and thereby improve coating high temperature oxidation resistance. The outward growth coating method can be used in the repair of engine run components, such as turbine blades.

BACKGROUND OF THE INVENTION

At temperatures greater than about 1000° C. (1832° F.), high temperature oxidation is the most important form of environmental attack observed with aluminide diffusion coatings. High temperature oxidation is a chemical reaction whose rate controlling process for an aluminide coating is the diffusion of aluminum through a product (oxide) layer. Diffusion is a thermally activated process, and consequently, the diffusion coefficients are exponential functions of temperature. Since the oxidation of aluminide coatings is a diffusion controlled reaction and diffusion coefficients are exponential functions of temperature, the oxidation rate is also an exponential function of temperature. At low temperatures where diffusion coefficients are relatively small, the growth rate of a protective scale on any aluminide coating is also small. Thus, adequate oxidation resistance should be provided by any state of the art aluminide coatings, such as: chromium aluminide, aluminide or two phase [PtAl$_2$+(Ni,Pt)Al] platinum aluminide, all inward grown coatings made by pack cementation. However, at high temperatures where the diffusion coefficients and consequently the oxidation rate increase rapidly with increasing temperature, only coatings which form high purity alumina (Al$_2$O$_3$) scales are likely to provide adequate resistance to environmental degradation. This point is clearly illustrated by the cyclic oxidation test results from three state of the art aluminide coatings (designated MDC-51, MDC-351 and LDC-2E by the Assignee, Howmet Corporation) on IN-100 substrates provided in FIG. 1. The observed variations in life of coatings with the same initial thickness is the result of differences in the growth rate and/or adherence of the protective oxide scale. Specifically, the dissolution of substitutional substrate alloying elements into the aluminide coating and consequently the alumina scale can result in doping effects which can produce significant increases in the growth rate of the oxide scale. In addition, the presence of surface active tramp substrate impurities (S, P etc.) in the aluminide coating can have a detrimental effect on the adherence of the protective oxide scale. Thus, the inward grown chromium modified and simple aluminides (which contain all the elements in the substrate) exhibit poor resistance to high temperature oxidation. The presence of platinum in nickel aluminide has been concluded to provide a number of thermodynamic and kinetic effects which promote the formation of a slow growing, high purity protective alumina scale. Consequently, the high temperature oxidation resistance of LDC-2E coating is about five times better than the other coatings, see FIG. 1, in spite of the fact it is an inward grown coating.

In recent years, several limitations of the industry standard, two phase [PtAl$_2$+(Ni,Pt)Al], inward grown platinum aluminide coatings have been identified. First, the two phase coatings have metastable phase assemblages and thicknesses, as demonstrated in engine tests at both General Electric and Rolls-Royce. Second, the two phase coatings are sensitive to TMF (thermal mechanical fatigue) cracking in engine service, and the growth of these coatings in service only makes this problem worse. Third, the thick, inward grown platinum aluminides exhibit rumpling during both cyclic oxidation and engine testing. This phenomenon can have undesirable consequences when platinum aluminide coatings are used as the bond coat in thermal barrier coating systems. Fourth, the two phase platinum aluminide coatings are hard and brittle, and this can result in chipping problems during post coat handling and assembly operations.

Many of the problems encountered with the previous industry standard platinum aluminides can be attributed to the two phase, inward grown structure and can be overcome by using outwardly grown, single phase platinum aluminde coatings as described, for example, in the Conner et al. technical articles entitled "Evaluation of Simple Aluminide and Platinum Modified Aluminide Coatings on High Pressure Turbine Blades after Factory Engine testing", Proc. AMSE Int. Conf. of Gas Turbines and Aero Engine Congress Jun. 3–6, 1991 and Jun. 1–4, 1992. For example, the outwardly grown, single phase coating microstructure on directionally solidified (DS) Hf-bearing nickel base superalloy substrates was relatively unchanged after factory engine service in contrast to the microstructure of the previous industry standard two phase coatings. Further, the growth of a CVD single phase platinum aluminide coating was relatively insignificant compared to two phase coatings during factory engine service. Moreover, the "high temperature low activity" outward grown platinum aluminide coatings were observed to be more ductile than inward grown "low temperature high activity" platinum aluminide coatings. These technical articles indicate only that the outwardly grown, single phase platinum aluminide coatings involved in the factory engine testing program were made by CVD aluminizing the substrate with a prediffused, electroplated platinum layer thereon.

SUMMARY OF THE INVENTION

The present invention provides a method of improving the oxidation resistance of a platinum modified aluminide coating on a nickel base superalloy substrate wherein the platinum modified aluminide coating is produced under CVD conditions effective to from an outwardly grown, single phase coating and concurrently reduce the concentration of one or more substrate substitutional alloying elements, such as W, Mo, etc., and/or one or more surface active tramp elements, such as B, P, and S, in the coating to improve coating high temperature oxidation resistance. The present invention relates to the discovery that certain CVD conditions associated with making outwardly grown, single phase platinum modified aluminide coatings on nickel base superalloy substrates achieve a purification effect on the as-formed coating from the standpoint of substantially reducing the concentration of one or more substrate substitutional alloying elements, such as W, Mo, etc., and/or one or more surface active tramp elements, such as B, P, and S, in the coating as compared to a platinum modified aluminide coating formed at a lower temperature. As noted hereabove, the substitutional impurities (particularly substrate refractory alloying elements) can produce doping effects which result in significant increases in the growth rate of the protective scale, and the surface active tramp elements can adversely effect the adherence of the protective scale.

Reductions of these elements in the coating improve coating high temperature oxidation resistance.

In particular, the present invention results from the discovery that exposure of a nickel base superalloy substrate at an elevated substrate coating temperature of at least about 1832° F. (1000° C.) in a coating retort to a high purity coating gas comprising a mixture of hydrogen and aluminum trichloride gases results in a significant decrease in the concentrations of substrate substitutional alloying elements and the surface active tramp elements that could be present in the platinum modified nickel aluminide additive layer. In generating the coating gas mixture of hydrogen and aluminum trichloride, a relatively low temperature coating gas generator residing external of the high temperature coating retort is used in practice of the invention and involves passing high purity hydrogen chloride and hydrogen carrier gases over a high purity source of aluminum at a relatively low temperature, such as not exceeding about 600° F. (316° C.). Preferably, in practicing the invention, a high purity (at least 99.999 weight % Al) source of aluminum is employed in the coating gas generator. High purity hydrogen typically comprises less than 30 ppb (parts per billion) impurities and high purity hydrogen chloride typically comprises less than 25 ppm (parts per million) impurities.

The present invention also involves repair of an engine-run component by overcoating with an outwardly grown Pt bearing aluminide coating of generally uniform thickness, as well as the repaired component, wherein the engine-run component has an existing aluminide coating at a region and an uncoated, fresh metallic repair material at another region. A layer of Pt is deposited on the regions and the Pt coated regions are aluminized under chemical vapor deposition conditions to outwardly grow a generally uniform thickness Pt bearing aluminide coating at the regions. The region having the existing aluminide coating typically is an airfoil region of a turbine blade and the repair material is at a tip region of the turbine blade.

DETAILED DESCRIPTION

Figure 1:
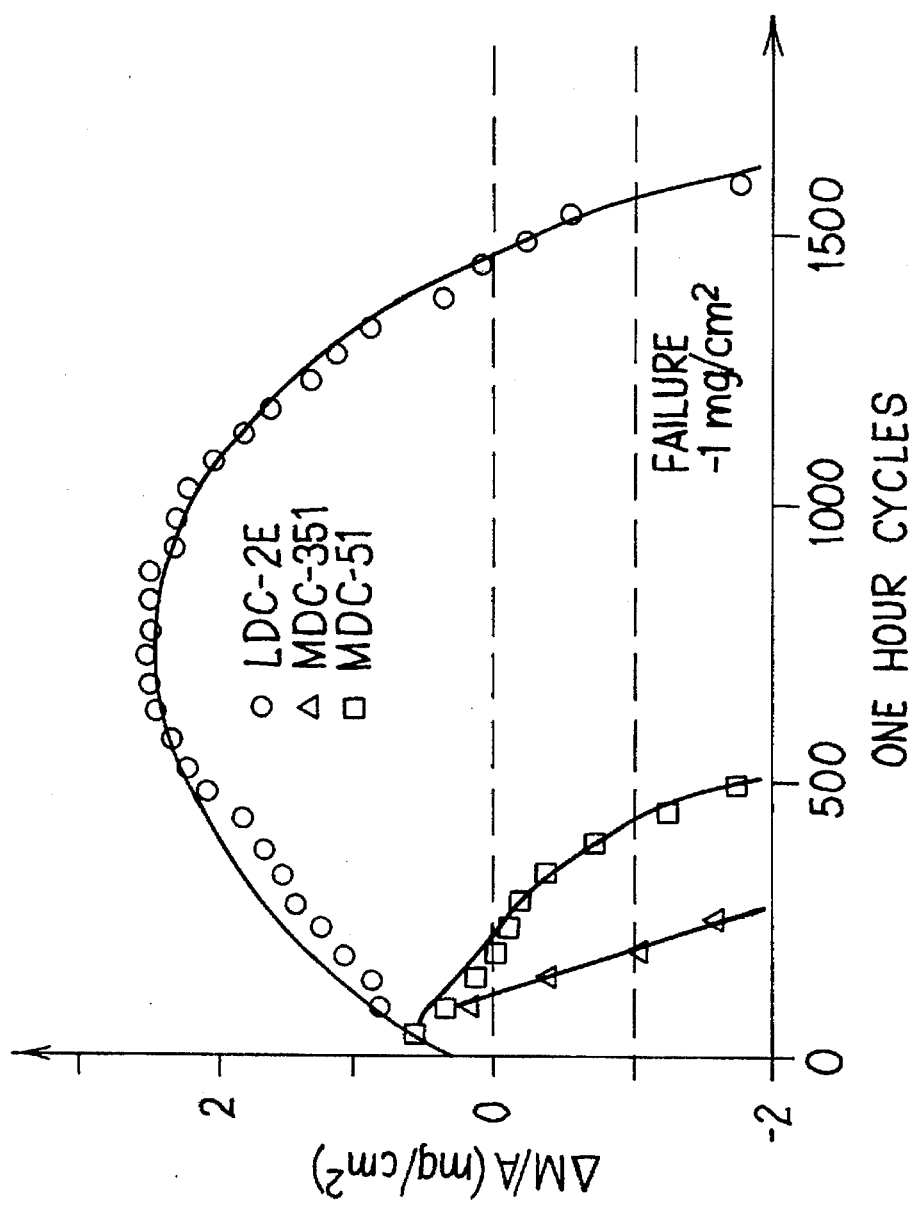
FIG. 1 is a graph depicting comparative cyclic oxidation resistance of various conventional aluminide coatings on IN 100 nickel base superalloy substrates.

The purification effects of the aforementioned CVD process for aluminizing were discovered in a series of coating experiments with 3 mil thick nickel foil substrates. The foil substrates were CVD coated in a manner to form 1) a simple aluminide single phase coating, 2) a hafnium modified outwardly grown, single phase aluminide coating and 3) a hafnium plus silicon modified CVD outwardly grown, two phase aluminide coating.

The coating parameters for each coating formed are set forth herebelow:

The simple aluminide coating 1) was formed at a substrate temperature of 1080° C. using coating gas mixture comprising 9 volume % aluminum trichloride and 91 volume % hydrogen at a flow rate of 300 standard cubic feet per minute (scfm). The coating gas mixture was generated by passing hydrogen and hydrogen chloride in mixture of hydrogen/13 volume % HCl over a 99.999% pure source of aluminum at 290° C.

The hafnium modified aluminide coating 2) was formed at a substrate temperature of 1080° C. using coating as mixture comprising 9 volume % aluminum trichloride, 89 volume % hydrogen and 2 volume % hafnium chloride at a flow rate of 300 scfm. The coating gas mixture was generated by passing hydrogen and hydrogen chloride in mixture of hydrogen/13 volume % HCl over a 99.999% pure source of aluminum at 290° C. A mixture of Ar/11 volume % HCl was flowed in an external chloride generator through a 99.99% pure hafnium bed at 430° C. to form hafnium chloride. The mixtures were introduced concurrently to the coating retort.

The hafnium plus silicon modified aluminide coating 3) was formed at a substrate temperature of 1080° C. using coating gas mixture comprising 9 volume % aluminum trichloride plus silicon tetrachloride, 89 volume % hydrogen, and 2 volume % hafnium chloride at a flow rate of 300 scfm. The aluminum based coating gas mixture was generated by passing hydrogen and hydrogen chloride in mixture of hydrogen/13 volume % HCl over a 99.999% pure source of aluminum and 99.9999% pure Si in an external chloride cogenerator at 290° C. A mixture of Ar/11 volume % HCl was flowed in a second external chloride generator through a hafnium bed at 430° C. to form hafnium chloride. The mixtures were introduced concurrently to the coating retort.

Inductively Coupled Plasma spectroscopy (ICP) was used to chemically analyze the starting foil substrate and the foil substrate with the simple CVD aluminide coating 1), the hafnium modified CVD aluminide coating 2), and the hafnium plus silicon modified CVD aluminide coating 3). The results are presented in Table 1, and indicate the CVD aluminizing process can have a significant impact upon the concentration of both the substitutional impurities (e.g. Cr and Fe) and the surface active impurity (e.g. S) in the aluminide coating. Based upon thermodynamic calculations, the removal of the substitutional impurities, Fe and impurities, Fe and Cr, involved chlorination of the metals and subsequent evaporation of the metal chlorides. The surface active impurity, sulfur, was removed by reaction with the hydrogen carrier gas to form $H_2S$ gas. HCl involved in the purification was produced by hydrogen reduction of metal halides in the coating gas on the sample surface.

Since the CVD process appeared to be capable of reducing the concentrations of both substrate (foil) substitutional impurity elements (which can cause doping effects) and surface active impurities (which can affect scale adherence), the next step in the evaluation of the purification effects of the CVD aluminizing process was to examine the aluminide coating compositional changes produced in a nickel base superalloy substrate of the type commonly used in the manufacture of turbine blades and vanes for gas turbine engines during the growth of a platinum modified aluminide coating.

In this series of experiments, IN-738 substrates (both foils 0.008 inch thick and 1/8 inch thick tabs suitable for oxidation testing from the same alloy heat) were coated using two different (a CVD and a pack cementation) aluminide coating processes for comparison purposes. These Pt aluminide coating processes produced: a) a coating designated LDC-2E that is an inward grown coating made by pack cementation, b) a coating designated MDC-150 that is an inward growth coating made by CVD outside the invention and c) a coating of the invention designated MDC-150L that is an outward grown coating made by CVD pursuant to the invention.

The LDC-2E aluminide coating a) was formed by first electroplating the substrate with a 9–11 milligrams/centimeter squared platinum layer, diffusing the Pt by heat treatment, and pack aluminizing the electroplated/diffused substrate at a substrate temperature of 1875° F. (1074° C.) using a pack composition comprising 33% by weight Al alloy and balance alumina.

The MDC-150 aluminide coating b) was formed by first electroplating the substrate with a 9–11 milligrams/centimeter squared platinum layer, diffusing the Pt by heat treatment, and then CVD aluminizing the electroplated diffused substrate at a substrate temperature of 1850° F. (1010° C.) using coating gas mixture comprising 9 volume % aluminum subchloride and 91 volume % hydrogen at a flow rate of 300 scfm. The coating as mixture was generated by passing hydrogen and hydrogen chloride in mixture of hydrogen/13 volume % HCl over a 99.999% pure source of aluminum at 290° C. and then passing the mixture through a high temperature generator to form a mixture of aluminum subchlorides.

The MDC-150L aluminide coating c) was formed by first electroplating the substrate with a 9–11 milligrams/centimeter squared platinum layer and then CVD aluminizing the electroplated substrate at a substrate temperature of 1080° C. using coating as mixture comprising 9 volume % aluminum trichloride and 91 volume % hydrogen at a flow rate of 300 scfm. The coating as mixture was generated by passing high purity hydrogen (e.g. less than 30 ppb impurities) and high purity hydrogen chloride (e.g. less than 25 ppm impurities) in mixture of hydrogen/13 volume % HCl over a high purity 99.999% pure source of aluminum at 290° C. No prediffusion heat treatment for the platinum layer was used. The HCl which produced the purification of the substrate and coating was produced by the hydrogen reduction of aluminum trichloride on the sample surface.

The foils were subsequently chemically analyzed using the following techniques: a) carbon and sulfur concentrations were measured with a Leco CS444LS analyzer, and b) major metal (P, W, B etc.) concentrations were established with the Perkin and Elmer 5000 Atomic Absorption Spectrometer. The results of the chemical analysis which distinguish the outwardly grown, single phase coating of the invention from the inwardly grown coatings produced by the other processes are presented in Table 2. Specifically, the CVD process of the invention removed both substitutional and surface active impurities from the nickel aluminide as it grew. It should be noted, platinum dissolved in nickel aluminide can inhibit the outward diffusion of impurities from the substrate into the coating, and this effect should help maintain the high purity of the nickel aluminide during testing or engine service. This could explain why the life of outwardly grown coatings improves as the concentration of Pt in the additive layer increases.

Figure 2A:
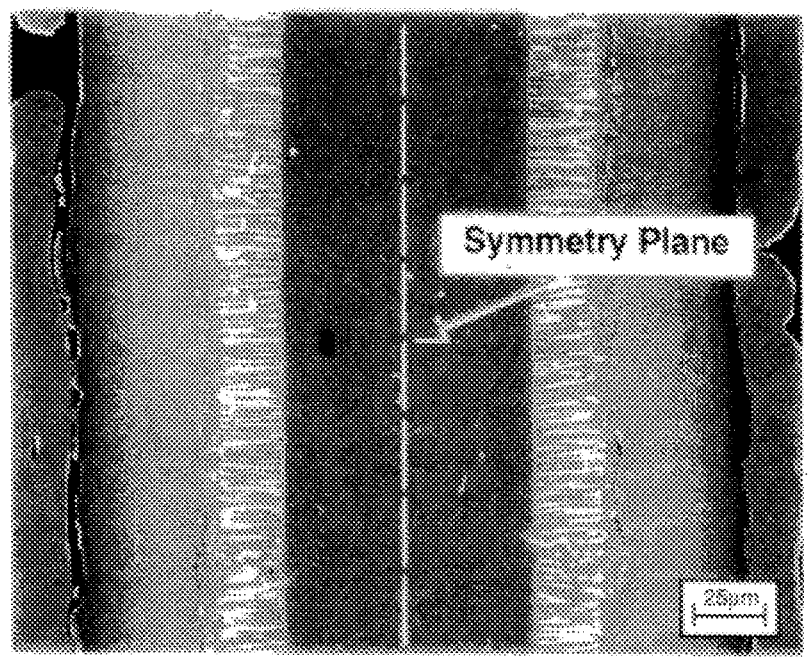
FIG. 2A is a photomicrograph of IN-738 nickel base superalloy foil CVD coated pursuant to an embodiment of the invention.
Figure 2B:
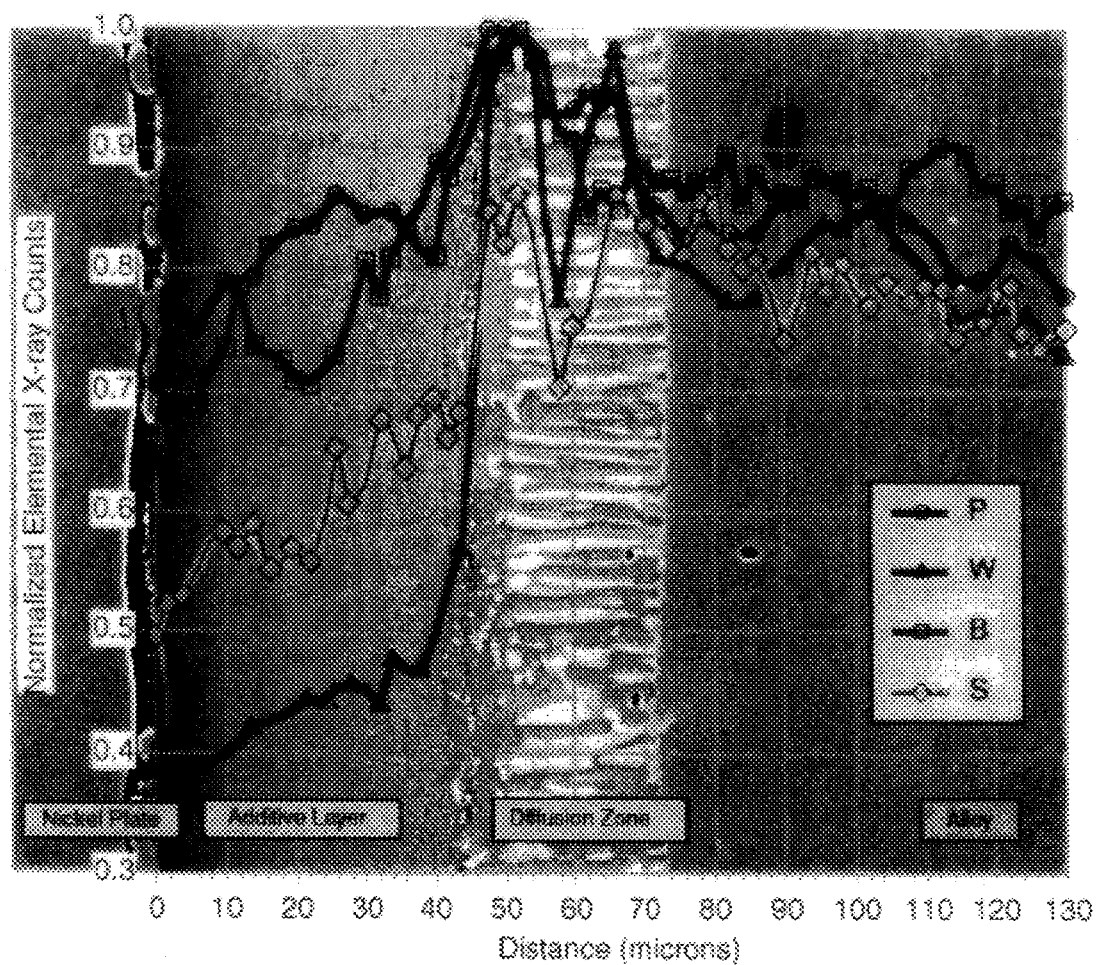
FIG. 2B is a graph of the B, P, S, and W concentrations in the thickness direction of the coating shown in FIG. 2A.

The purification effect of the CVD aluminizing process was also demonstrated by the composition profiles of FIG. 2B across the MDC-150L coated foil shown in FIG. 2A. As can be seen, the concentrations of S,P,B and W decrease continuously from a maximum in the diffusion zone to minimum values (significantly below those in the alloy) at the external surface. Concentration gradients of this type are typical of gas-solid reactions where solute elements are being removed from the external surface of the solid by chemical reaction with the gas phase. It should be noted that the structure and composition gradients were symmetric about a plane through the midthickness of the foil, so that only one half of the profile is shown in FIG. 2. Also, the concentration profiles were smoothed for clarity, and the X-ray counts for each element were normalized to the maximum value in the sample so all the data could be shown on one graph.

Superalloys contain different concentrations of a variety of substitutional solutes, and the removal of these elements during the CVD process involves the chlorination of the metal and subsequent evaporation of the metal chlorides. Since the diffusion coefficients of various alloying elements in nickel aluminide differ, the free energies of formation and the boiling points of the various metal chlorides differ and much of this data is not available in the scientific literature. It would be difficult to predict which elements will be removed during the CVD coating of an alloy of interest. The available thermodynamic data on substitutional alloying elements commonly used in superalloys are summarized in Table 3. In addition, the valance of the substitutional impurities in their most stable oxide, and the excess charge each element produces when dissolved in $Al_2O_3$ are provided in Table 3.

It is known however, that charge neutrality must be maintained in oxide crystals. Hence, when a cation with a charge greater than or less than 3+ is dissolved in alumina, the point defect concentration must change to compensate for the excess charge. The refractory elements generally have a more positive charge than aluminum in oxides, see Table 3, and so the substitution of a refractory element cation for $Al^{3+}$ results in an excess positive charge on the cation site in aluminum oxide. Alumina is a p-type semiconductor; therefore the excess positive charge produced by cations with valences greater than 3+ is balanced by the elimination of electron holes and/or the creation of aluminum vacancies. Any increase in the aluminum vacancy concentration over the equilibrium value results in an increase in the cation diffusion rate, and consequently, the growth rate of the alumina scale. This phenomenon is commonly known as a doping effect, and it can have a significant effect of the oxidation resistance of an aluminide coating.

TABLE 1

CHEMICAL ANALYSIS OF Ni FOIL SAMPLES

| ELEMENT | Ni FOIL | CVD ALUMINIZE | CVD Al – Hf | CVD Al + Hf + SI |
|---------|---------|---------------|-------------|------------------|
| Cr | 0.17% | — | 0.07% | 0.06% |
| Fe | 0.31% | 0.01% | 0.14% | 0.16% |
| S | 0.008% | 0.0017% | 0.0006% | 0.001% |

Note to Table 1:
The substitutional solutes in the nickel aluminide coating were removed by chlorination of the metals and subsequent evaporation of the metal chloride, in accordance with the following reactions.
$Cr(s) + 3/2\ Cl_2 = CrCl_3(g)$
$Fe(s) + 3/2\ Cl_2 = FeCl_3(g)$

TABLE 2

CHEMICAL ANALYSIS OF IN-738 SAMPLES

| ELEMENT | Pt PLATED | LDC-2E COATED | MDC-150 COATED | MDC-150L COATED |
|---------|-----------|---------------|----------------|-----------------|
| B | 0.012% | 0.013% | 0.015% | 0.005% |
| P | 0.045% | 0.044% | 0.039% | 0.014% |
| S | 6 ppm | 7 ppm | 8 ppm | 5 ppm |
| W | 2.39% | 2.3% | 0.57% | 0.13% |

Note to Table 2:
The substitutional solute in the nickel aluminide coating was removed by chlorination of the metal and subsequent evaporation of the metal chloride, in accordance with the following reaction.
$W(s) + 5/2\ Cl_2 = WCl_5\ (g)$
Some of the surface active tramp impurities were removed by chlorination and subsequent evaporation of the chlorides and the sulfur was taken out by reaction with the hydrogen carrier gas, as shown in the following expressions.
$P(s) + 3/2\ Cl_2 = PCl_3\ (g)$
$B(s) + 3/2\ Cl_2 = BCl_3\ (g)$
$S(s) + H_2 = H_2S\ (g)$

COATING STRUCTURE AND THICKNESS

Figure 3A:
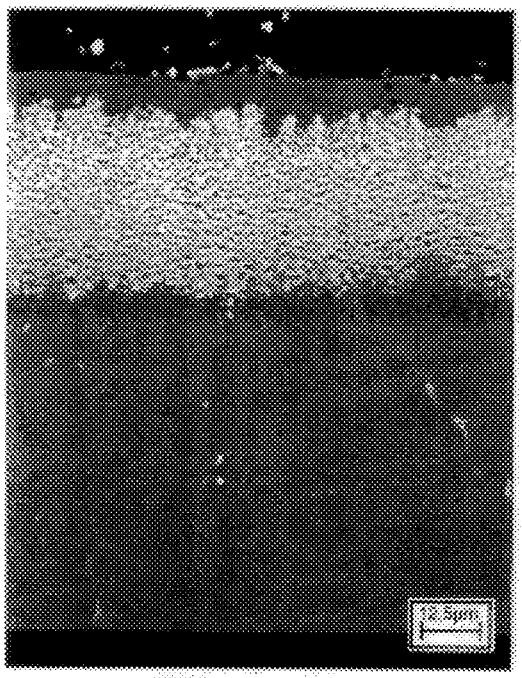
FIGS. 3A and 3B are photomicrographs of an inwardly grown, two phase platinum modified aluminide coating designated LDC-2E as coated on IN-738 nickel base superalloy substrate (FIG. 3A) and as coated and solution heat treated (FIG. 3B).
Figure 4A:
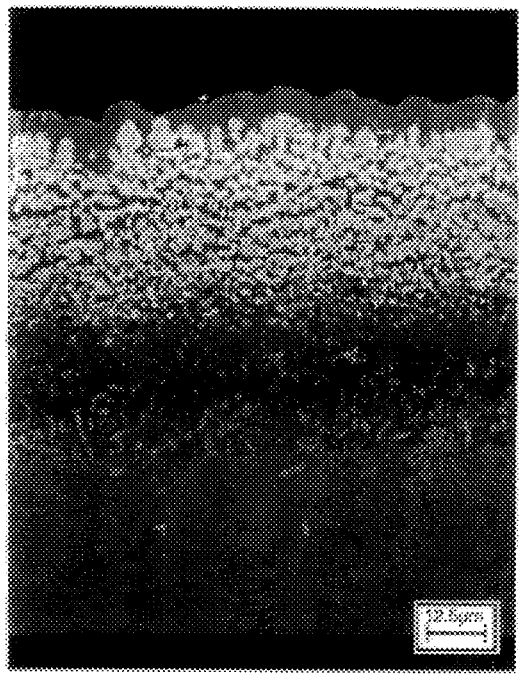
FIGS. 4A and 4B are photomicrographs of an inwardly grown, two phase platinum modified aluminide coating designated MDC-150 as coated on IN-738 nickel base superalloy substrate (FIG. 4A) and as coated and solution heat treated (FIG. 4B).
Figure 5A:
FIGS. 5A and 5B are photomicrographs of an outwardly grown, single phase platinum modified aluminide coating of the invention designated MDC-150L as coated on IN-738 nickel base superalloy substrate (FIG. 5A) and as coated and solution heat treated (FIG. 5B).

In the as coated condition, both the LDC-2E coating a) and MDC-150 coating b) exhibited a two phase outer layer (see FIGS. 3A and 4A) on top of an (Ni,Pt)Al layer and finally a thin diffusion zone. This structure is typical of the present industry standard platinum aluminides. In contrast, the MDC-150L coating c) of the invention exhibited a single phase (Ni,Pt)Al additive layer, and about one third of the thickness was diffusion zone, see FIG. 5A. A well developed diffusion zone is characteristic of a growth process dominated by the outward transport of nickel. In the as coated condition, the coating thicknesses were as follows: LDC-2E coating a)=1.96 mils, MDC-150 coating b)=2.11 mils and MDC-150L coating c)=3.13 mils.

Figure 3B:
Figure 4B:
Figure 5B:
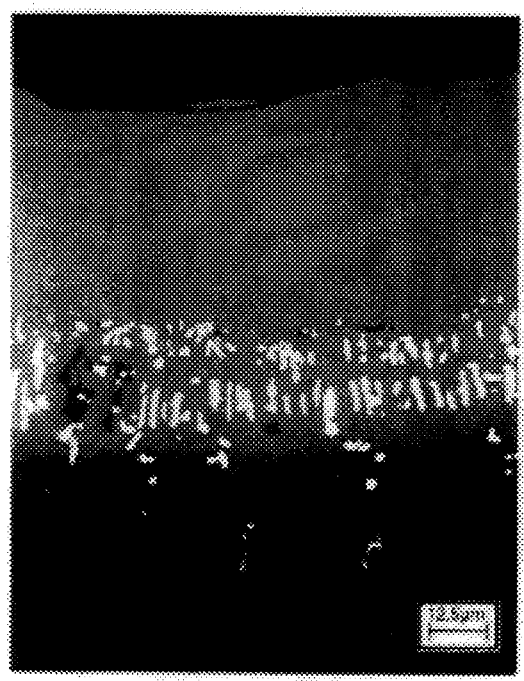

After solution heat treatment at 2050° F. for 120 minutes, both the LDC-2E b) and MDC-150 b) two phase coatings exhibited significant changes in structure, composition and thickness (FIGS. 3B, 4B), while the MDC-150L coating c) was relatively unaffected (FIG. 5B). Specifically, the coatings were all single phase following the heat treatment, the average Pt and Al concentrations (see FIGS. 3 and 4) decreased significantly, and the thicknesses increased about 52% and 67% for LDC-2E coating a) and MDC-150 coating b), respectively. In comparison, the changes in the MDC-150L coating c) after the thermal cycle (see FIG. 5B) were insignificant. It should be noted that the observed metamorphoses of the two phase coatings a) and b) during the solution heat treatment is similar to the changes encountered during engine testing.

CYCLIC OXIDATION TEST RESULTS

The IN-738 test tabs with the three different Pt aluminide coatings a), b) and c) were used for cyclic oxidation testing at 1100° C. A one hour cycle included: fifty minutes at temperature and ten minutes cooling to room temperature.

TABLE 3

ELEMENTS WHICH CAN BE CHLORINATED DURING THE CVD CYCLE

| ELEMENT | HALIDE | G° 1500K (KCAL/MOLE) | VOLATILIZATION POINT | VALENCE IN OXIDE | EXCESS CHARGE IN $Al_2O_3$ |
|---------|--------|----------------------|----------------------|------------------|---------------------------|
| Ti | $TiCl_4$ | −69.1 | $T_B = 136°$ C. | 4+ | 1+ |
| Ta | $TaCl_5$ | −49.7 | $T_B = 233°$ C. | 5+ | 2+ |
| Cr | $CrCl_3$ | −34.8 | $T_S = 947°$ C. | 3+ | 0 |
| W | $WCl_5$ | −6.8 | $T_B = 276°$ C. | 6+ | 3+ |
| Mo | $MoCl_5$ | −4.1 | $T_B = 267°$ C. | 6+ | 3+ |
| Re | $ReCl_3$ | — | $T_B = 827°$ C. | 7+ | 4+ |
| Cb | $CbCl_5$ | — | $T_B = 243°$ C. | 5+ | 2+ |
| Fe | $FeCl_3$ | — | $T_B = 319°$ C. | 3+ | 0 |
| V | $VCl_4$ | — | $T_B = 164°$ C. | 5+ | 2+ |

EXAMPLES OF CYCLIC OXIDATION TESTING OF PLATINUM ALUMINIDES

The evaluation of the aforementioned coatings for cyclic oxidation testing involved first examining coating structure and thickness to be tested. The following paragraphs summarize the results of the metallographic and electron microprobe analysis of these coatings in both the as coated and the as coated and solution heat treated condition, see FIGS. 3, 4 and 5 for LDC-2E aluminide coating a), MDC-150 aluminide coating b), and MDC-150L aluminide coating c) the outwardly grown, single phase coating of the invention, respectively.

Figure 6:
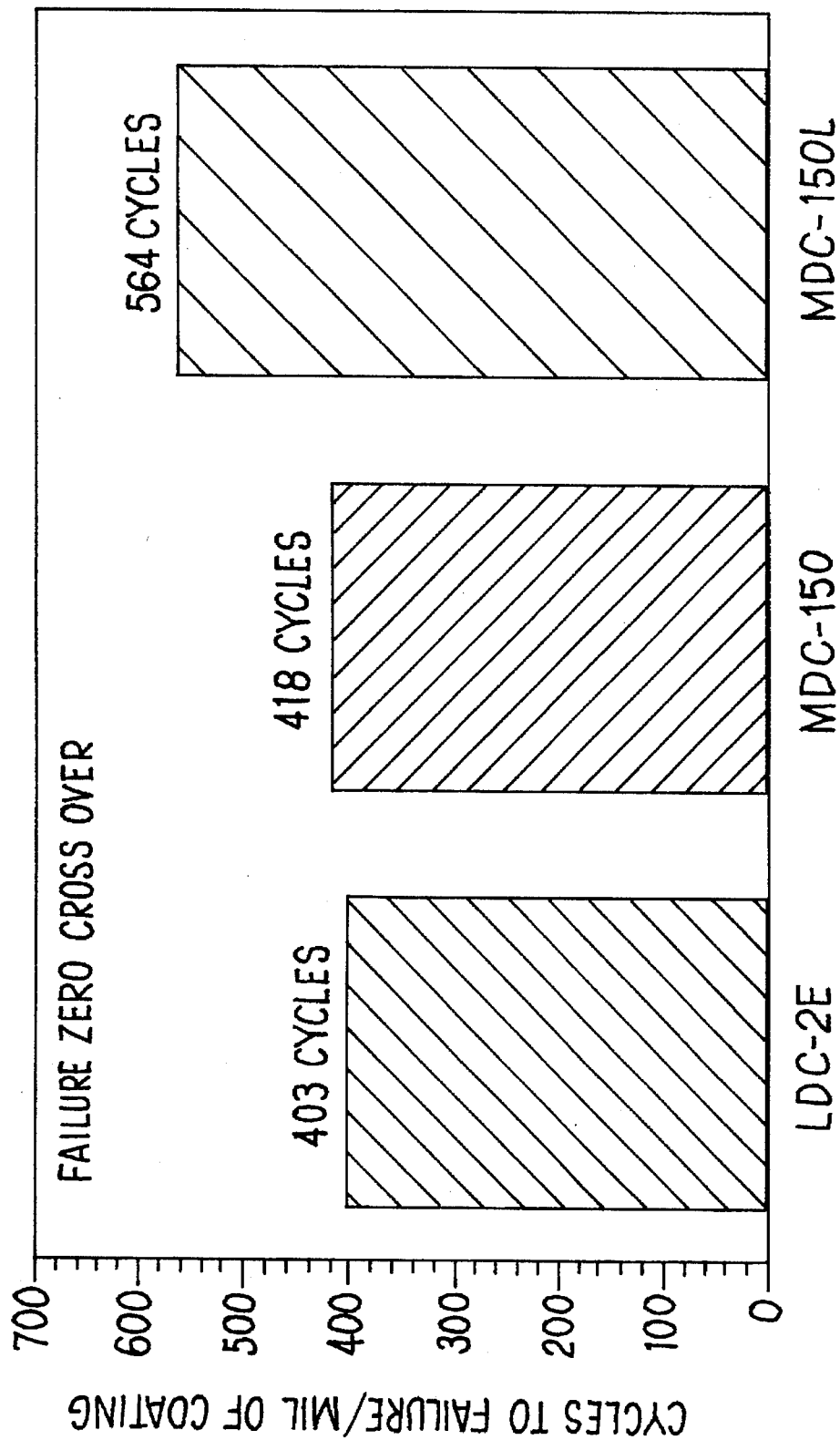
FIG. 6 is a bar graph of the 1100° C. cyclic oxidation resistance of the as coated and heat treated IN 738 substrates of FIGS. 3B, 4B, and 5B.
Figure 7A:
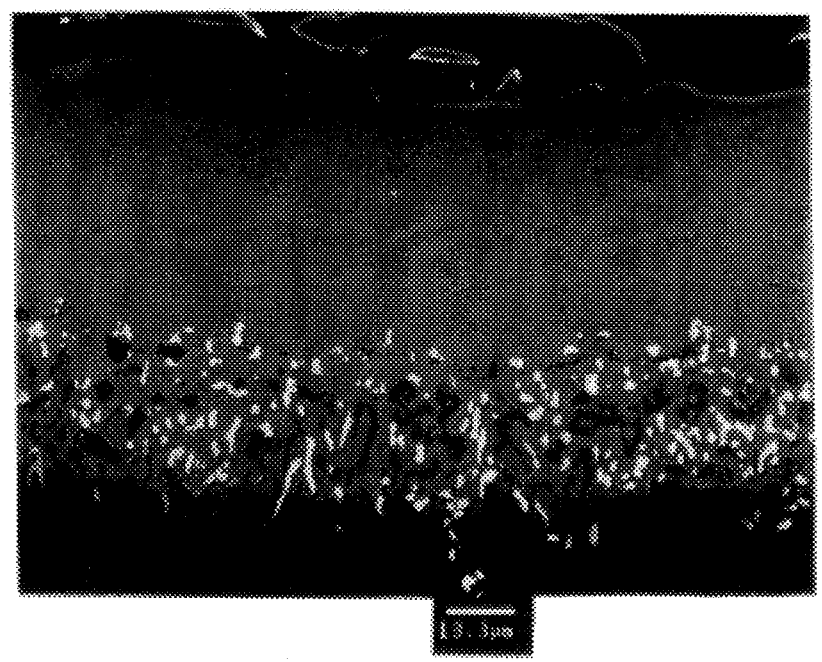
FIG. 7A is a backscatter electron image of a repaired coated blade tip region of an engine-run turbine blade pursuant to another embodiment of the invention and FIGS. 7B through 7D are X-ray maps for Al, Ni, and Pt of the coating on the repaired tip region.
Figure 7B:
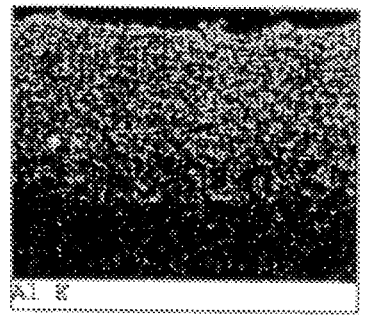
Figure 7C:
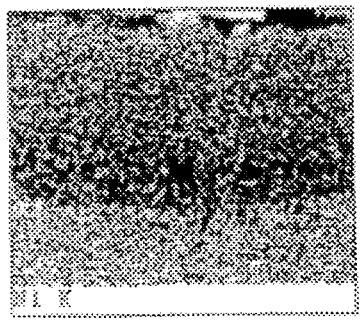
Figure 7D:
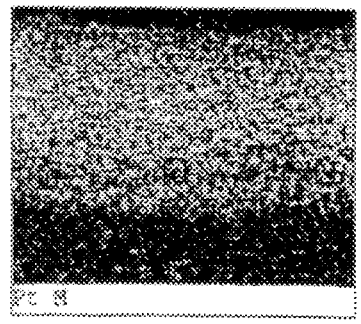
Figure 8A:
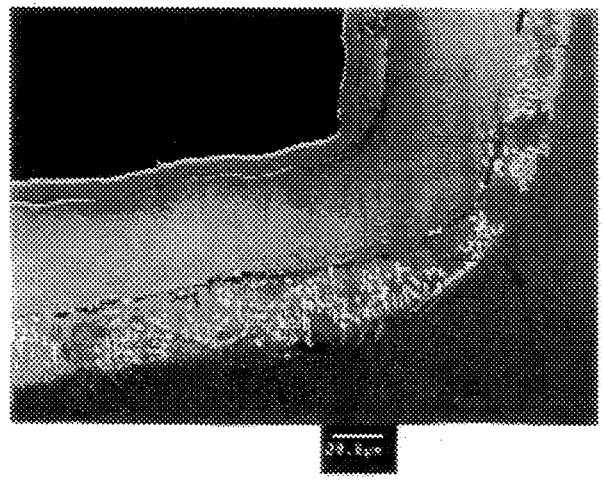
FIG. 8A is a backscatter electron image of a repaired overcoated transition region of an engine run turbine blade between the blade tip and airfoil regions pursuant to another embodiment of the invention and FIGS. 8B through 8D are X-ray maps for Al, Ni, and Pt of the overcoating on the repaired transition region.
Figure 8B:
Figure 8C:
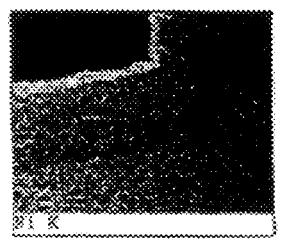
Figure 8D:
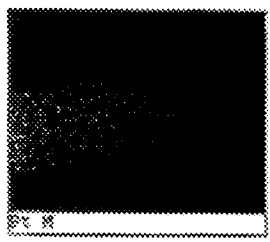

Samples were weighed to the nearest 0.1 milligram (mg) before the test and after each fifty cycle test interval. Failure was defined as zero crossover; that is, when the sample weight after a test interval equaled the initial weight. For each coating, three samples were tested to failure, and then the cycles to failure were averaged. The average number of cycles to failure was subsequently normalized to account for differences in coating thickness. The results of the testing are summarized in FIG. 6. A comparison of the normalized test results for the three platinum modified aluminide coatings shows that the MDC-150L coating c) (i.e. the outward grown CVD coating of the invention) had about 40% longer life than LDC-2E coating a) and about a 35% life improvement compared to MDC-150 coating b). The superior oxidation resistance of the MDC-150L coating c) compared to the two inward grown, two phase coatings a) and b) results from the purification produced by CVD aluminizing at high temperature (1080° C.) in a mixture of hydrogen, hydrogen chloride and aluminum trichloride gases. That is, the higher purity MDC-150L coating c) formed a slower growing more adherent protective alumina scale, and consequently, exhibited greater oxidation resistance.

The CVD purified outward grown, single phase [(Ni,Pt)Al ] platinum modified aluminide coating of the invention represents a significant advancement in platinum modified aluminide coating technology. Specifically, the CVD method of the invention substantially reduces the concentration of substrate substitutional alloying elements, such as W, Mo, etc., and surface active tramp elements, such as B, P, and S, in the coating. Consequently, the coating of the invention exhibits better resistance to high temperature oxidation than a standard two phase coating.

In practicing the present invention, the substrate temperature in the coating retort is at least about 1000° C., and the coating gas generated at low temperature outside the coating retort comprises hydrogen and aluminum trichloride. The aluminum trichloride typically does not exceed about 10 volume % of the coating gas, and preferably is in the range of 4 to 6 volume % of the coating gas. The coating flow rate typically is within the range of 200 to 400 scfm. Moreover, the invention is preferably practiced by CVD aluminizing the nickel base superalloy coated with the platinum layer directly without a prediffusion heat treatment of the platinum into the substrate.

In the past, nickel based superalloy high pressure blades have been traditionally repaired in the following manner: (1) strip engine run coating from the component, (2) repair the component, primarily by removing the damaged blade tip section and applying a new tip either by welding or brazing, and (3) recoating the entire component.

This type of repair (termed a "full repair") has been in use for a number of years, especially on high pressure blades. Until very recently, the coatings used on these components have been a simple aluminide coating applied by pack cementation techniques.

One of the most significant limitations of this conventional repair technique is that when the engine run coating is stripped, a substantial amount of wall thickness of the blade base material is also removed. Therefore, the number of repairs of this type to which the blade can be subjected has traditionally been limited to one for the life of the blade.

Because of this limitation a repair technique termed a "mini repair" was developed. In this case the repair steps are as follows: (1) remove the damaged tip section while leaving the coating on the balance of the blade intact, (2) apply a new tip to the blade, and (3) apply a simple aluminide coating to the new blade tip by a slurry coating application (so called "Sermetal J").

A blade repaired in this manner is limited in the sense that the un-repaired portion of the blade is returned to engine service without improvement of the existing engine run coating which is on the majority of the blade. Some coating processes have used a pack cementation aluminide coating to recoat the entire blade, but the growth nature of such coatings ("inward") has led to coatings of a significantly different thickness on the blade with the overcoated area being substantially thicker than the coating on the newly applied tip area.

In addition, over the past few years the use of simple aluminide coatings on these high pressure blades have been replaced by platinum modified aluminide coatings at the OEM stage. Therefore, during the repair cycle, a number of the end users (airlines, etc.) would like to have a platinum modified aluminide coating applied to older model blades which had originally been simple aluminide coated.

In order to address the above limitations, the present invention also provides an overcoating method of applying a platinum modified aluminide coating to engine run blades which does not require the stripping of the engine run coating and thus is achieved without loss of base material wall thickness.

The present invention in one embodiment involves practicing the aforementioned outwardly grown coating method to repair an engine-run component, such as a turbine blade, that includes a preexisting, engine-run aluminide coating over some blade regions (e.g. airfoil region) but no aluminide coating at other blade regions, such as, for example, the blade tip region where fresh blade tip material is applied by, for example, welding, brazing and the like, to the uncoated (stripped) tip region. The invention can be practiced to grow (overcoat) a relatively uniform thickness Pt aluminide coating on the different regions of such an engine-run component in a one step process.

In order to produce the platinum modified aluminide coating or overcoat on an engine run component, the invention electroplates (or otherwise deposits) platinum on the engine-run component turbine blade). The electroplated Pt unexpectedly can be deposited without spallation of the as platinum plated or subsequently aluminized coating. The Pt electroplate can be deposited in an amount of 9-10 grams/cm$^2$ on the blade.

The CVD aluminizing process employed to overcoat the platinum plated blade preferably is of a completely "outward" nature as described hereabove for producing the MDC-150L Pt aluminide coating, as opposed to the "inward" or "intermediate" nature of conventional pack cementation or out of contact pack type techniques (such as "above the pack"). The use of such a completely outward CVD aluminizin technique is self limiting in nature in the sense that areas of the previously aluminide coated repaired blade do not gain much additional coating thickness while areas of the previously aluminide coated repaired blade which are significantly lacking in coating are returned to the required coating thickness.

For purposes of illustration, an engine-run turbine airfoil (turbine blade or vane) which has had a standard tip repair comprises an uncoated tip material (e.g. IN 625) welded onto a blade tip region previously stripped of coating material. The blade has an existing engine-run simple aluminide coating at, for example, the airfoil region. The blade (substrate) can comprise Rene 80 alloy for example. A platinum modified aluminide coating of relatively uniform thickness which incorporates the existing engine run simple aluminide coating can be produced by first platinum plating the entire gas path surface area of the airfoil (9 to 10 grams/cm$^2$ Pt layer), then aluminizing that area with a CVD outward growth process of the type described to form the MDC-150L coating hereabove. In the regions where there is engine run aluminide coating, the diffusion distance of nickel required for coating growth is large (e.g. 0.0025 to 0.004 inches), and so, the growth rate is very low Compared to the uncoated tip reion. Thus, at these already coated regions, two processes occur: (1) diffusion of platinum into the engine run aluminide coating and (2) slow growth of the coating. The coating process in the tip and weld areas follows a normal growth sequence; that is, a very rapid growth rate initially which gradually decreases as the coating thickness (nickel diffusion distance) increases. The result is a platinum modified aluminide coating produced over the entire gas path area of the airfoil which is fairly uniform in thickness between 0.003 to 0.0045 inches thickness) and which incorporates the engine run coating in its structure. Thus, the natural rate controlling process of an outward growth aluminide coating (diffusion of nickel through the coating) limits coating growth in the previously coated areas enough that the coating thickness on the tip and weld areas can become nearly equal to that on the majority of the airfoil where the existing engine run alumnide coating was present.

With this overcoating process of this invention, gas turbine engine users can obtain the improved resistance to environmental degradation provided by a platinum modified aluminide coating without performing the one full repair which is allowed before the overall condition of the airfoil requires extensive rework.

Metallographic examination of cross-sections through over coated, engine run high pressure turbine hardware illustrates this repair process of the invention. Cross-sections of samples overcoated in the manner described hereabove were examined on an electron microscope, and the analysis included: photomicrographs and X-ray maps for the major coating constituents. This type of data was obtained in two areas of the airfoils: (1) the coated tip and (2) the transition between the coated welded tip and the overcoated airfoil. In the following paragraphs a brief discussion of the results will be provided.

The results of the metallographic and microprobe analysis from the coated replacement blade tip are presented in FIGS. 7A, 7B, 7C and 7D. Examination of this information indicates the coating on the tip has a structure and element distribution typical of the aforementioned MDC-150L coating. Specifically, the additive layer is single phase (Ni,Pt)Al with a fairly uniform distribution of elements. The as coated thickness is about 80 microns, of which about 65% is additive layer and 35% is diffusion zone (indicative of outward coating growth).

The most dramatic example of the diffusion distance limiting coating growth enough in overcoated areas to permit the aluminide coating on the tip to attain a similar thickness as that on formed on the existing aluminide coated airfoil regions can be found in the transition region between the new tip and the overcoated airfoil. FIGS. 8A, 8B, 8C and 8D contain metallographic and microprobe results for a typical transition region from the coated tip weld into the overcoated airfoil region. As can be seen, the overall coating thickness in the weld and overcoated areas are nearly equal. The results clearly indicate that the natural rate controlling process involved with the outward growth aluminide coating can be utilized to produce an aluminide overcoating of nearly equal thickness in the repaired tip having no existing coating and the airfoil region having an existing engine run aluminide coating thereon.

It should be noted however, that the maximum thickness which the repair process of the invention can produce on polycrystalline alloys is in the range of about 70 to 90 microns. Thus, if the thickness of the engine run aluminide coating on the airfoil region is greater than about 70 microns, the process will not produce a thick enough coating on the repaired tip area (sans coating) to equal that on the airfoil region. For example, for an overcoated airfoil where the engine run aluminide coating was approximately 130 microns thick as received from the overhaul shop, following the overcoat process, the coating in the airfoil region was about 145 microns thick, which represents only a 10% increase in thickness compared to the as received condition. Hence, use of the overcoat process of this invention should include an evaluation of the thickness of the existing engine run coating on the component to be repaired, and then, some means should be employed to reduce the thickness of the existing engine run coating which exceed about 70 microns to 90 microns, such means comprising a partial strip of the coating for example.

Although the invention has been described with respect to certain specific embodiments thereof, those skilled in the art will recognize that these embodiments were offered for the purpose of illustration rather than limitation and that the invention is not limited thereto but rather only as set forth in the appended claims.

We claim:

1. A method of improving the oxidation resistance of a platinum modified aluminide coating formed on a nickel base superalloy substrate, comprising:

providing a platinum layer on the substrate and aluminizing the substrate by chemical vapor deposition with said platinum layer on said substrate without a prediffusion of said platinum layer into said substrate prior to said chemical vapor deposition including heating the substrate in a coating retort to a temperature of at least about 1000° C., introducing a coating gas comprising hydrogen and aluminum trichloride into the coating retort to contact the heated substrate, and forming an outwardly grown, single phase (Ni,Pt)Al platinum modified aluminide coating by said contact and reducing concentration of at least one of a substitutional alloying element of said substrate in said coating and a surface active tramp element selected from at least one of B, P, and S in said coating to improve oxidation resistance of said coating.

2. The method of claim 1 wherein the coating gas is formed by passing high purity hydrogen and hydrogen chloride gases over a high purity source of aluminum.

3. The method of claim 2 wherein the high purity aluminum source is 99.999 weight % Al or higher.

4. The method of claim 2 wherein the coating gas is generated at a temperature not exceeding 300° C.

5. The method of claim 1 wherein the substrate includes a refractory metal alloying element whose concentration in the coating is reduced by chlorination of the refractory metal and evaporation of the refractory metal chloride at said substrate temperature.

6. The method of claim 1 wherein the substrate includes a surface active tramp element selected from one of B and P whose concentration in the coating is reduced by chlorination of the tramp element and evaporation of the tramp element chloride at said substrate temperature.

7. The method of claim 1 wherein the substrate includes sulfur as a surface active tramp element, the concentration of sulfur in the coating being reduced by reaction of the sulfur with hydrogen in the coating gas to form hydrogen sulfide.

8. A method of repairing an engine-run component having an existing aluminide coating at a region and an uncoated, metallic repair material at another region, comprising providing at said region an existing aluminide coating with a thickness not exceeding about 70 microns, depositing a layer comprising platinum on both of said regions and aluminizing both of the platinum coated regions under chemical vapor deposition conditions effective to outwardly grow a platinum bearing aluminide coating at both of said regions having nearly equal coating thickness at both of said regions.

9. The method of claim 8 wherein the region having the existing aluminide coating is an airfoil region of a turbine blade and the repair material is at a tip region of the turbine blade.

10. The method of claim 8 wherein the Pt coated regions are aluminized at a temperature of at least about 1000° C.

11. A method of repairing an engine-run component having an existing aluminide coating at a region and an uncoated, metallic repair material at another region, comprising providing at said region an existing aluminide coating with a thickness not exceeding about 70 microns, depositing a layer comprising platinum on both of said regions and aluminizing the platinum coated regions without a prediffusion treatment of the platinum layer into said substrate under chemical vapor deposition conditions effective to outwardly grow a platinum bearing aluminide coating at both of said regions having nearly equal coating thickness at both of said regions.

* * * * *